United States Patent
Kang et al.

(10) Patent No.: US 8,604,586 B2
(45) Date of Patent: Dec. 10, 2013

(54) HIGH BREAKDOWN VOLTAGE EMBEDDED MIM CAPACITOR STRUCTURE

(75) Inventors: Wootag Kang, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 565 days.

(21) Appl. No.: 12/536,819

(22) Filed: Aug. 6, 2009

(65) Prior Publication Data

US 2011/0031586 A1 Feb. 10, 2011

(51) Int. Cl.
*H01L 27/06* (2006.01)

(52) U.S. Cl.
USPC ............. 257/532; 257/E29.343; 257/E27.034

(58) Field of Classification Search
USPC ............ 257/532, E29.343, E27.034, E27.084
See application file for complete search history.

(56) References Cited

U.S. PATENT DOCUMENTS

| | | | |
|---|---|---|---|
| 5,856,938 A | 1/1999 | Kasai | |
| 6,803,641 B2 * | 10/2004 | Papa Rao et al. | 257/532 |
| 2001/0031528 A1 | 10/2001 | Tsugane | |
| 2004/0007747 A1 * | 1/2004 | Visokay et al. | 257/391 |
| 2004/0126981 A1 | 7/2004 | Rao et al. | |
| 2006/0099760 A1 * | 5/2006 | Kim et al. | 438/250 |
| 2007/0004119 A1 * | 1/2007 | Chun | 438/199 |
| 2007/0096191 A1 | 5/2007 | Lee | |
| 2010/0065944 A1 * | 3/2010 | Tu et al. | 257/532 |

FOREIGN PATENT DOCUMENTS

| | | |
|---|---|---|
| JP | H11330272 A | 11/1999 |
| JP | 2004214668 A | 7/2004 |
| JP | 2008288372 A | 11/2008 |

OTHER PUBLICATIONS

International Search Report—PCT/ US2010/044724, International Search Authority—European Patent Office Nov. 24, 2010.
Written Opinion—PCT/ US2010/044724, International Search Authority—European Patent Office Nov. 24, 2010.

* cited by examiner

*Primary Examiner* — Wensing Kuo
(74) *Attorney, Agent, or Firm* — Sam Talpalatsky; Nicholas J. Pauley; Joseph Agusta

(57) ABSTRACT

Methods and devices related to a plurality of high breakdown voltage embedded capacitors are presented. A semiconductor device may include gate material embedded in an insulator, a plurality of metal contacts, and a plurality of capacitors. The plurality of capacitors may include a lower electrode, a dielectric formed so as to cover a surface of the lower electrode, and an upper electrode formed on the dielectric. Further, the plurality of contacts may connect each of the lower electrodes of the plurality of capacitors to the gate material. The plurality of capacitors may be connected in series via the gate material.

19 Claims, 18 Drawing Sheets

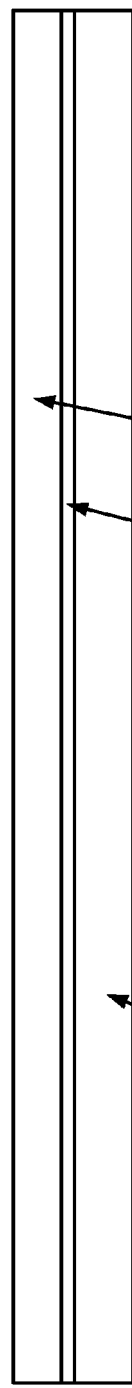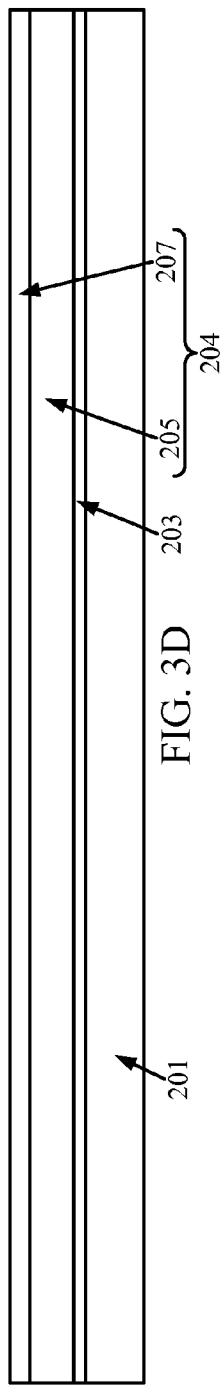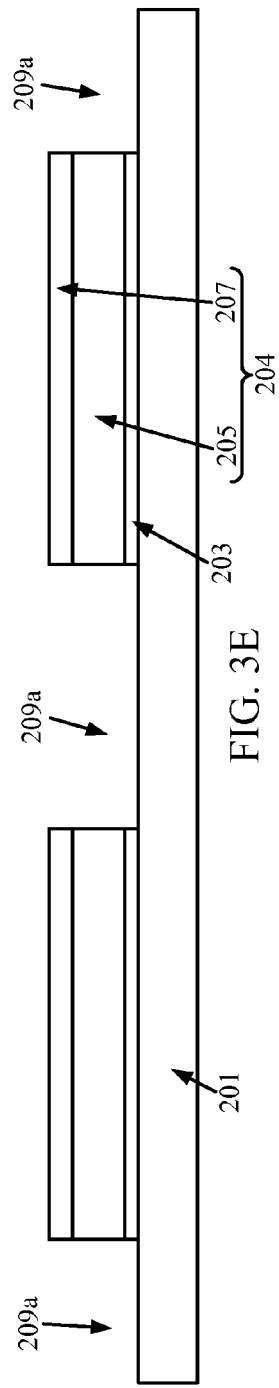

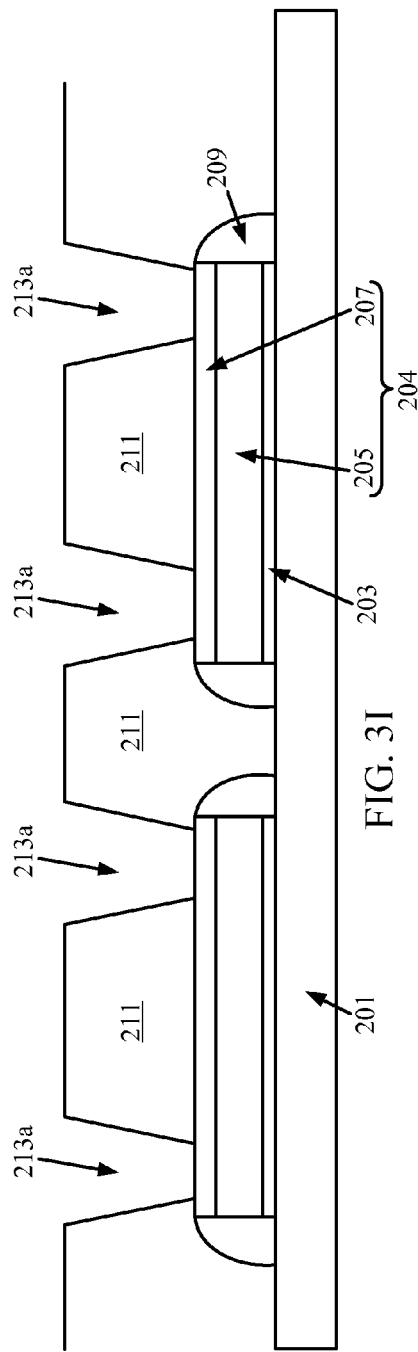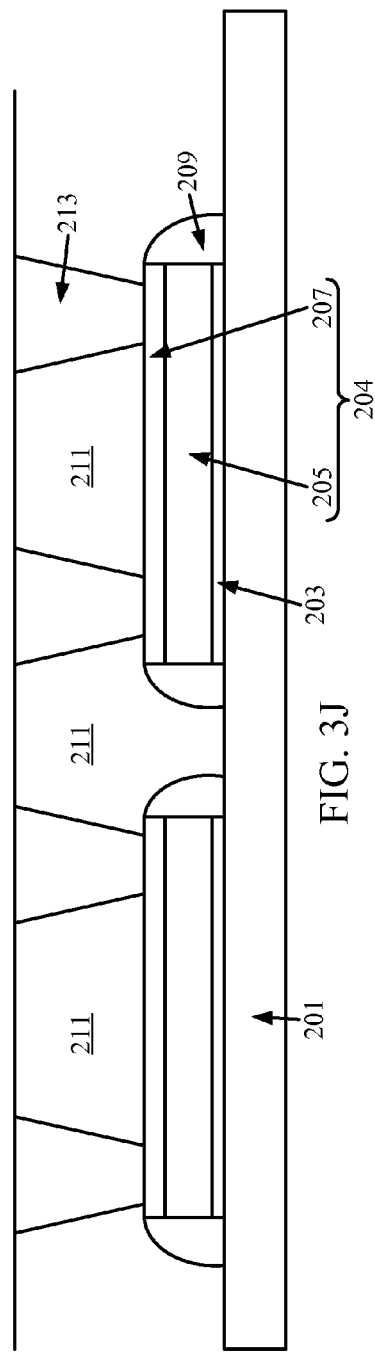

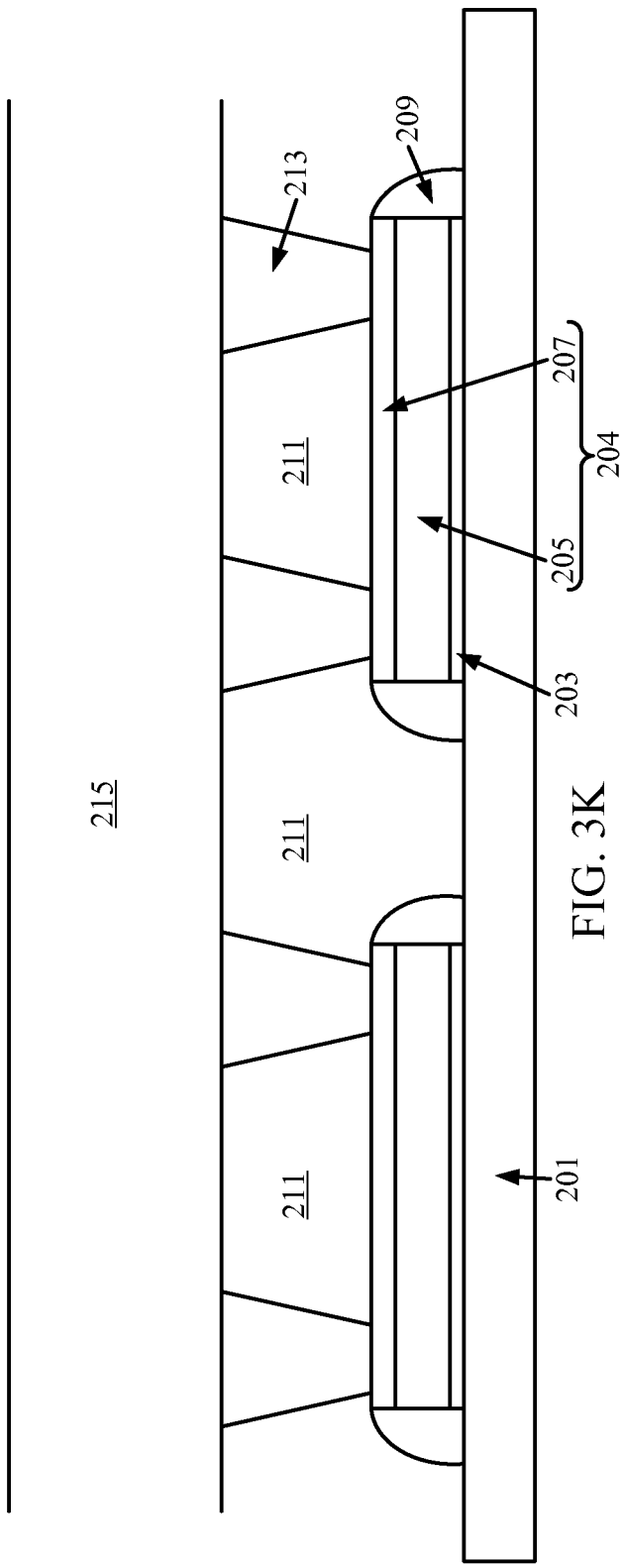

HIGH BREAKDOWN VOLTAGE EMBEDDED MIM CAPACITOR STRUCTURE

FIELD OF DISCLOSURE

Disclosed embodiments are generally directed to the fabrication of semiconductor devices, and more particularly to the fabrication of high breakdown voltage embedded metal-insulator-metal (MIM) capacitor structures.

BACKGROUND

Use of and interest in merged memory and logic semiconductor devices is increasing. A merged memory and logic device is a structure where a memory, such as a DRAM, and a logic, such as a logic circuit, are implemented in a single chip. Implementation of a memory and logic in a single chip in a merged memory and logic semiconductor device is advantageous over conventional chips as high-speed and low-power driving is possible without any particular change in design. Furthermore, merged memory and logic semiconductor devices may include a number of common hardware devices including capacitors.

Capacitors are elements that are used extensively in semiconductor devices for storing an electrical charge. Capacitors essentially comprise two conductive plates separated by an insulator. The capacitance, or amount of charge held by the capacitor per applied voltage, depends on a number of parameters such as the area of the plates, the distance between the plates, and the dielectric constant value of the insulator between the plates, as examples. Capacitors can be used in filters, analog-to-digital converters, memory devices, control applications, and many other types of semiconductor devices.

One type of capacitor is a Metal Insulator Metal (MIM) capacitor, which is frequently used in mixed signal devices and logic semiconductor devices, as examples. MIM capacitors are used to store a charge in a variety of semiconductor devices. MIM capacitors are often used as storage nodes in a memory device, for example. A MIM capacitor is typically formed horizontally on a semiconductor wafer, with two metal plates sandwiching a dielectric layer parallel to the wafer surface. Therefore, MIM capacitors have often been referred to as thin-film capacitors. As a result, it is difficult to manufacture MIM capacitors which have a relatively large capacitance per unit area.

Furthermore, conventional MIM capacitors have low breakdown voltages and typically are not suitable to be used in high voltage applications, for example, greater than 2.5V. As a result, a need exists for embedded MIM capacitors capable of handling higher voltage applications with larger breakdown voltage tolerances.

SUMMARY

Exemplary embodiments are directed to a semiconductor device that may include gate material embedded in an insulator; and first and second capacitors, each capacitor comprising: a lower electrode; a dielectric formed so as to cover the surface of the lower electrode; and an upper electrode formed on the dielectric, wherein metal contacts couple the lower electrode of each of the capacitors to the gate material, and wherein the first and second capacitors are connected in series via the gate material.

Another embodiment may include a method for fabricating a semiconductor device having a plurality of embedded capacitors comprising: embedding a gate material in an insulating layer; forming a plurality metal contacts; forming first and second capacitors, wherein each of the capacitors comprises: a lower electrode formed from a first metal layer; a dielectric formed so as to cover the surface of the lower electrode; and an upper electrode formed from a second metal layer formed on the dielectric; and connecting each of the lower electrodes of the capacitors to the gate material via the metal contacts, wherein the first and second capacitors are connected in series via the gate material.

Another embodiment may include a method for fabricating a semiconductor device having a plurality of embedded capacitors comprising: step for embedding a gate material in an insulating layer; step for forming a plurality of metal contacts; step for forming first and second capacitors, wherein each of the capacitors comprises: a lower electrode formed from a first metal layer; a dielectric formed so as to cover the surface of the lower electrode; and an upper electrode formed from a second metal layer formed on the dielectric; step for connecting each of the lower electrodes of the capacitors to the gate material via the metal contacts, wherein the plurality of capacitors are connected in series via the gate material.

Another embodiment may include a semiconductor device comprising: means for insulating a gate material; first and second capacitors, each comprising: a lower electrode; a dielectric formed so as to cover a surface of the lower electrode; and an upper electrode formed on the dielectric; and means for coupling each of the capacitors to the gate material, wherein the capacitors are connected in series via the gate material.

BRIEF DESCRIPTION OF THE DRAWINGS

The accompanying drawings are presented to aid in the description of embodiments and are provided solely for illustration of the embodiments and not limitation thereof.

DETAILED DESCRIPTION

Figure 1A:
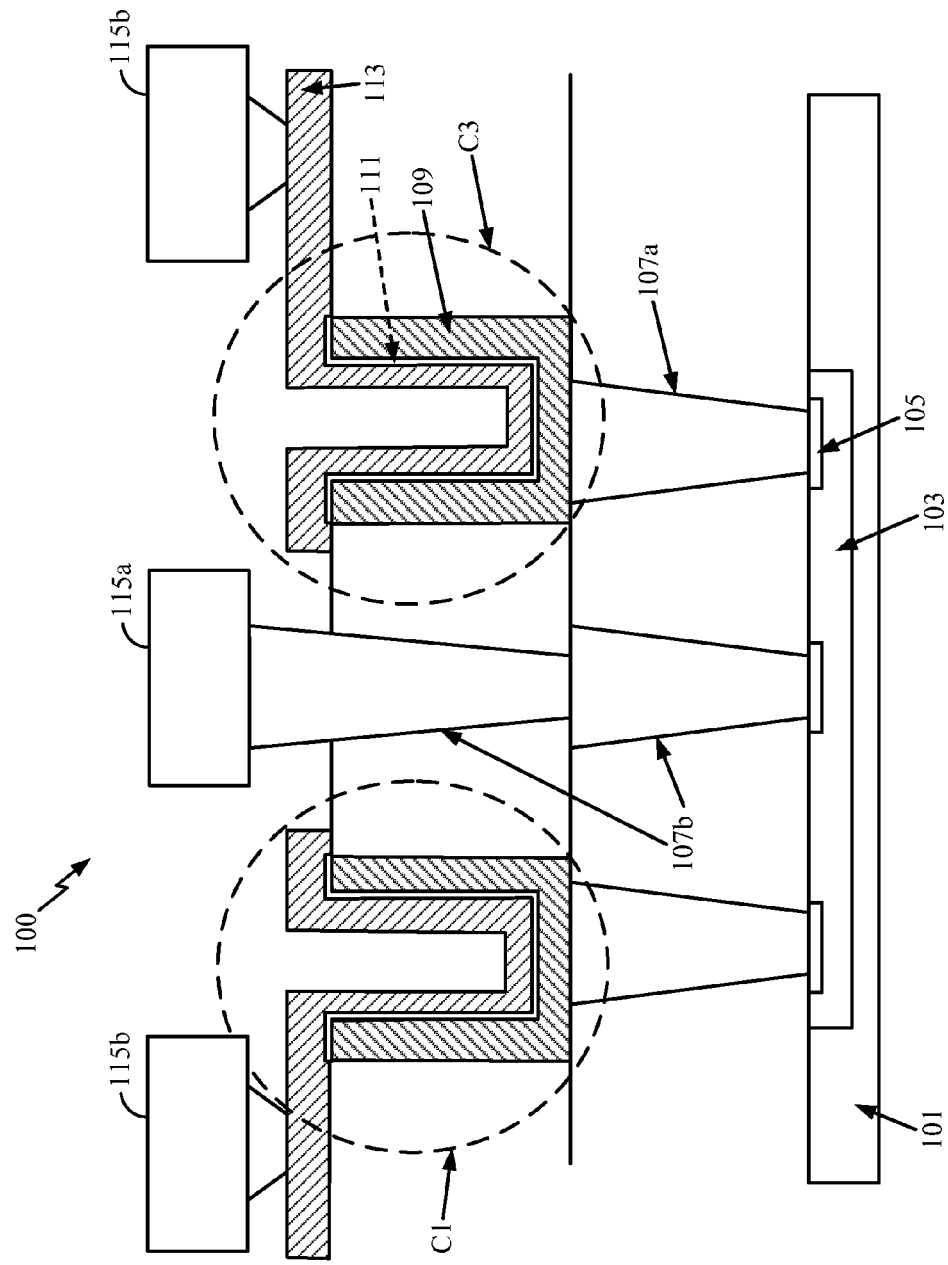
FIG. 1A illustrates a conventional semiconductor employing MIM capacitors.

Aspects of the embodiments are disclosed in the following description and related drawings directed to such embodiments. Alternate embodiments may be devised without departing from the scope of the invention. Additionally, well-known elements of the embodiments will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments of the disclosure" does not require that all embodiments of the disclosure include the discussed feature, advantage or mode of operation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

In the subsequent figures, the thickness and areas of various layers and structures may be enlarged for the purposes of illustration and/or clarity. Additionally, when layers, films, areas and plates formed on other elements are illustrated, it may not exclude other elements interposed therebetween. Further, the terms "connect", "connected", "connection", "couple", "coupled" and variations thereof, do not require that the elements be directly connected (i.e., having no intervening elements) and also do not exclude that the elements may be connected directly.

Figure 1B:
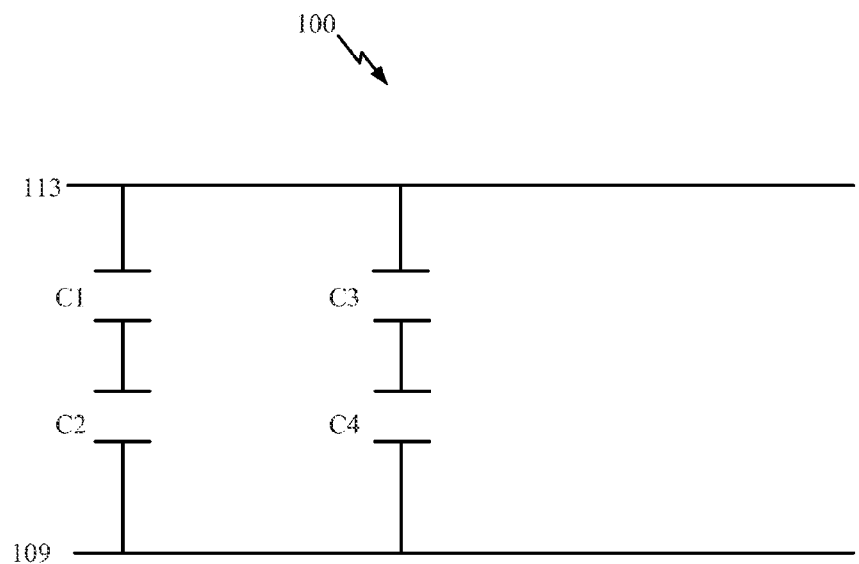
FIG. 1B illustrates a series equivalent circuit of a plurality of MIM capacitors.

Referring to FIG. 1A, a conventional semiconductor employing MIM capacitors 100 is illustrated. The MIM capacitors 100 illustrated in FIG. 1A are arranged in parallel. A series equivalent circuit of a plurality of MIM capacitors is shown in FIG. 1B. The MIM capacitor structure shown in FIG. 1A employs two capacitors C1 and C3 connected in parallel. Furthermore, it is conventional to externally connect the parallel capacitors in series.

MIM capacitor 100 may include parallel capacitors C1 and C3. Capacitors C1 and C3 may include a lower electrode 109 made of a metal, a dielectric 111 formed of an oxide insulator stacked on the lower electrode 109 and an upper electrode 113 typically made of a plate metal stacked on the dielectric 111.

MIM capacitor 100 is formed on a semiconductor substrate 101. A diffusion region 103 is formed on the substrate 101 and a NiSi junction 105 is formed over the diffusion region 103. The diffusion region 103 may be an n-type or p-type semiconductor material. The vertical thickness of the diffusion region 103 may be used to increase or decrease the amount of leakage current. Therefore, the smaller the vertical thickness of the diffusion region 103, then the larger the resultant leakage current is. In the conventional MIM structure the leakage current may be concentrated in the diffusion region 103.

The NiSi junction 105 can be connected to contacts 107a and 107b. Further, contacts 107a can be utilized to connect parallel capacitors C1 and C3 to the NiSi junction 105. Contacts 107b may be of the dual-contact variety and can be utilized to connect NiSi junction 105 to top plate metal 115a and 115b.

Conventional diffusion junctions typically may have large series sheet and contact resistances. Furthermore, MIM capacitor types may have low breakdown voltages which can present difficulties in the design of CMOS type circuitry, including that used for radio frequency (RF) applications.

In order to solve the low breakdown voltages of MIM capacitor devices, the MIM capacitors shown in FIG. 1A may be connected in series. However, each of the MIM capacitor networks would be connected to each other via an external series connection which increases sheet and contact resistance and complicates the MIM capacitor forming/manufacturing process. Further, the process utilized to form the diffusion area 105 on an Si substrate is limited by the transistor source/drain design. The capacitance leakage of the exemplary MIM capacitor device 100 shown in FIG. 1A utilizing a diffusion area can have a concentrated junction leakage at the NiSi diffusion area.

FIG. 1B is a series equivalent circuit of a plurality of MIM capacitors. Capacitors C1 and C2 (similarly constructed as C1) may be connected to each other in a series connection and capacitors C3 and C4 (similarly constructed as C3) can be connected to each other in series. Further, the series connection of C1 and C2 may be in parallel with capacitors C3 and C4. FIG. 1B illustrates that the top electrode 113 may be connected to a positive voltage terminal (not shown) and the lower electrode 109 can be connected to ground. However, it is understood that the top electrode 113 may be connected to ground (not shown) and the lower electrode 109 can be connected to a positive voltage terminal (not shown).

Figure 2B:
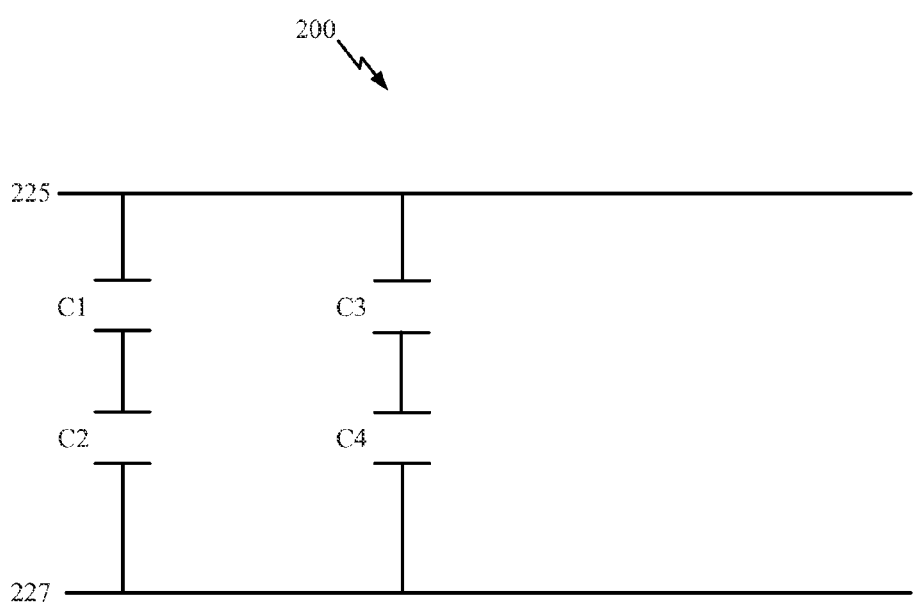
FIG. 2B illustrates an equivalent circuit of the plurality of MIM capacitors C1, C2, C3 and C4 shown in FIG. 2A.
Figure 2A:
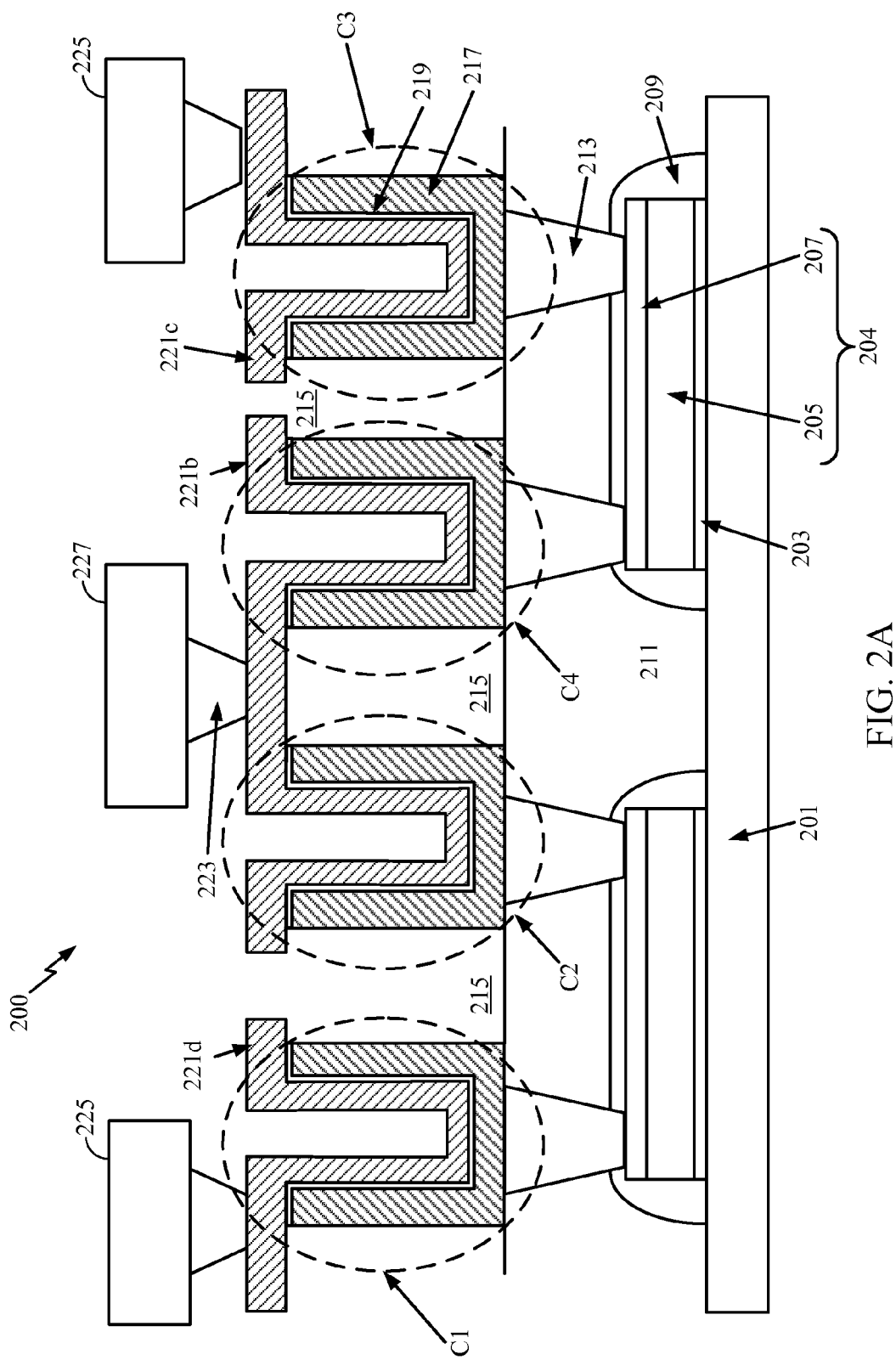
FIG. 2A illustrates a cross sectional view of an exemplary semiconductor device having an exemplary MIM capacitor.

FIG. 2A is a cross sectional view of an exemplary semiconductor device having an exemplary MIM capacitor according to at least one embodiment.

As disclosed in FIG. 2A, the exemplary MIM capacitor 200 may include a lower electrode 217, a dielectric 219 formed so as to cover the surface of the lower electrode 217, and a upper electrode 221 formed on the dielectric 219. The lower electrode 217 may be formed of any suitable metal (e.g., TiN). Likewise, the dielectric 219 may be formed of any suitable material, such as a high k dielectric, an oxide, etc. The upper electrode 221 may be formed of any suitable metal (e.g., TiN). As illustrated in FIG. 2A, the example MIM capacitor 200 is of a well-type structure. Therefore, the lower electrode 217, dielectric layer 219 and the upper electrode 221 may cover a greater area which allows for a higher-density capacitance.

The exemplary MIM capacitor 200 may be formed on a substrate 201. For example, the substrate 201 can be either a p-type semiconductor material or an n-type semiconductor material. A first insulating layer 203 is formed over the substrate 201. For example, the first insulating layer 203 may be made of an oxide based material in order to insulate the substrate 201 from upper layers (for example, gate material 204). The gate material 204 may be formed on the first insulating layer 203 in an island shape. The gate material 204 can include multiple layers or can be a single layer. The exemplary embodiment illustrates the gate material 204 including a doped layer 205 and a first metal layer 207. For example, the doped layer 205 can be formed using either a n+ doped material or a p+ doped material and the first metal layer 207 can be formed of NiSi by a silicidation process. Silicidation is an anneal (sintering) process resulting in the formation of metal-Si alloy (silicide) to act as a contact; e.g. Ni deposited on Si forming NiSi. The doped layer 205 can be formed over the first insulating layer 203 and the first metal layer 207 can be formed over the doped layer 205. Further, for example, the gate material 204 may connect capacitors C1 and C2 in series and may connect capacitors C3 and C4 in series. Thus, the gate material 204 may lower the series sheet and contact resistance and may also double the breakdown voltage via the series connection of the embedded capacitors. Further, the gate material 204 can be substantially thicker than the first insulating layer 203 resulting in a larger breakdown voltage. For example, the gate material 204 can be at least three times thicker than the first insulating layer 203.

The gate material 204 can be covered by a second insulating layer 209. For example, the second insulating layer 209 may be of the same material as the first insulating layer 203 such that the gate material 204 is encapsulated by either the first insulating layer 203 or the second insulating layer 209.

The second insulating layer 209 can be covered by a third insulating layer 211. For example, the third insulating layer 211 may be of the same material as the first insulating layer 203 or second insulating layer 209 such that the gate material 204 is encapsulated by any of the first insulating layer 203, the second insulating layer 209 or the third insulating layer 211. Accordingly, in one embodiment various insulating layers illustrated may be considered one layer. In addition to gate material 204, the second insulating layer 209 and the third insulating layer 211 may contain a plurality of contacts 213.

Contacts 213 may be formed in the second insulating layer 209 and the third insulating layer 211. The contacts can be used to connect the gate material 204 to the capacitors C1, C2, C3 and C4. For example, contacts 213 may connect the gate material 204 with capacitors C1 and C2 in series and may also connect the gate material 204 with capacitors C3 and C4 in series.

A fourth insulating layer 215 may be formed on top of the third insulating layer 211. The fourth insulating layer 215 can be used in order to electrically isolate capacitors C1, C2, C3 and C4. Furthermore, for example, the fourth insulating layer 215 may be of the same material as any of the other insulating layers 203, 209 and/or 211 such that the contacts 213 may be encapsulated. Further, the first insulating layer 203, the second insulating layer 209, the third insulating layer 211 and/or the fourth insulating layer 215 can be formed of any oxide material.

A plurality of lower electrodes 217 may be formed in the fourth insulating layer 215. Each of the lower electrodes 217 may be used in order to form capacitors C1, C2, C3 and C4. The dielectric layer 219 may be formed on the plurality of lower electrodes 219. Further, the dielectric layer 219 may also be formed on both the well and the upper surface of each of the lower electrodes 219 in order to maximize the surface area for each of the capacitors C1, C2, C3 and C4.

A plurality of upper electrodes 221b-d may be formed from metal layer deposited over the fourth insulating layer 215 and on top of the dielectric layer 219. Each of the upper electrodes 221b-d may be used in order to form capacitors C1, C2, C3 and C4. Additionally, as illustrated, the plurality of upper electrodes arranged such that the upper electrodes 221b connect capacitors C2 and C4 to a common contact 227 and facilitate the parallel connection of capacitors C1 and C2 with capacitors C3 and C4.

A plurality of contacts 223 may connect a plurality of storage metal plates 225 and common plate 227 to the upper electrodes 221. The contacts 223, storage metal plates 225 and common plate 227 may be formed of any metal material or any combination of materials with metallic properties.

The plurality of storage metal plates 225 may be formed directly on top of the contacts 223. Further, the plurality of storage metal plates 225 can provide electrical connection between capacitors C1, C2, C3 and C4 and any voltage sources (not shown).

Furthermore, the storage metal plates 225 may be orthogonal to the upper electrodes 221. In another exemplary embodiment, the connection between the storage metal plates 225 and the contacts 223 may be located outside of the MIM capacitor 200.

A common plate 227 may be formed directly on top of one of the contacts 223. Further, the common plate 227 can provide electrical connection between capacitors C1, C2, C3 and C4 and any common or ground sources (not shown). Furthermore, the common plate 227 may be orthogonal to the upper electrodes 221. In another exemplary embodiment, the connection between the common plate 227 and the contacts 223 may be located outside of the MIM capacitor 200.

As a result, the MIM capacitor shown in FIG. 2A may exhibit numerous beneficial properties when compared with a conventional MIM capacitor. For example, using NiSi as an exemplary gate material 204 for the bottom series connection (instead of the conventional diffusion junction) may reduce the series sheet and contact resistance, when compared to a diffusion connection. Further, the process utilized to make the exemplary gate material 204 and the contacts 213 is less complex than forming a diffusion area on an Si substrate since the substrate is limited by the transistor source/drain design.

Furthermore, the capacitance leakage of the exemplary MIM capacitor device 200 shown in FIG. 2A is reduced when compared with a conventional MIM contact utilizing a diffusion area (e.g. FIG. 1A) because there is no MIM contact junction leakage at the gate material 204/contacts 213 interface; whereas the conventional MIM contact utilizing a diffusion area has a concentrated junction leakage at the NiSi diffusion area.

Also, the exemplary embodiment of the MIM capacitor 200 may improve the breakdown voltage of the embedded MIM capacitor and can overcome difficulties related to conventional CMOS technology processes.

FIG. 2B is an equivalent circuit of the plurality of MIM capacitors C1, C2, C3 and C4 shown in FIG. 2A. Capacitors C1 and C2 may be connected to each other in a series connection and capacitors C3 and C4 can be connected to each other in series. FIG. 2B illustrates that the storage plate metal 225 may be connected to a positive voltage terminal (not shown) and that the common plate 227 can be connected to ground.

However, it is understood that the storage plate metal 225 may be connected to ground (not shown) and the common plate 227 can be connected to a positive voltage terminal (not shown).

A method of manufacturing a high breakdown voltage embedded MIM capacitor according to an exemplary embodiment is described below.

Figure 3F:
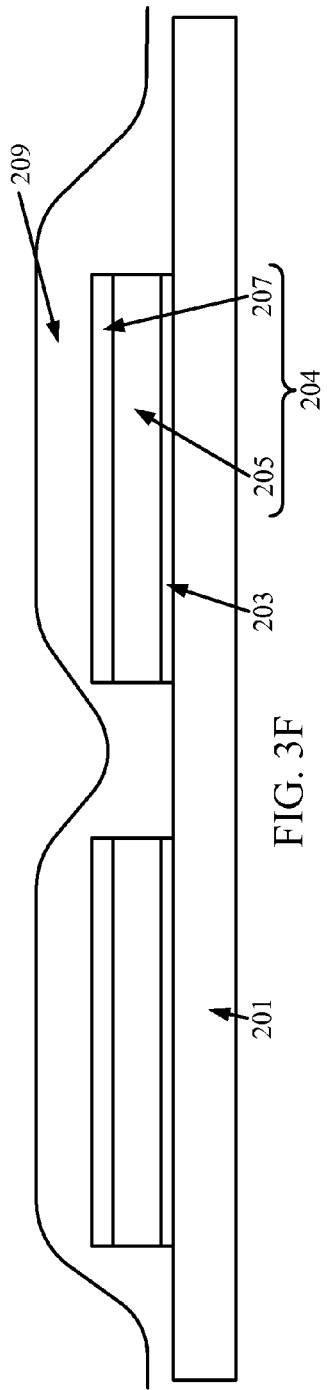
FIGS. 3A to 3V illustrate cross sectional views illustrating a process of manufacturing a high breakdown voltage embedded MIM capacitor according to an exemplary embodiment.
Figure 3G:
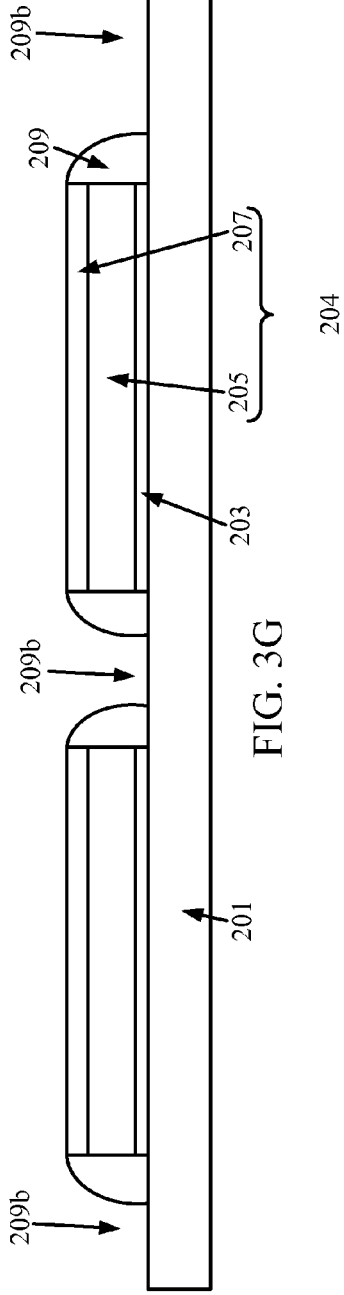
Figure 3H:
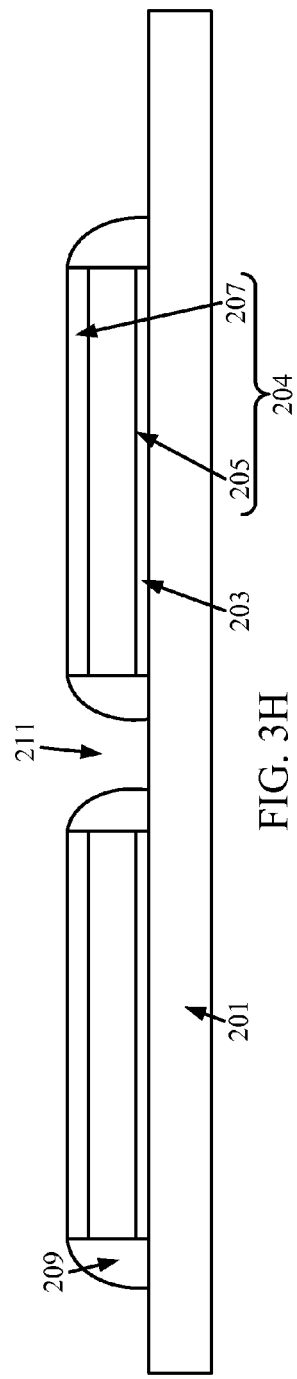
Figure 3L:
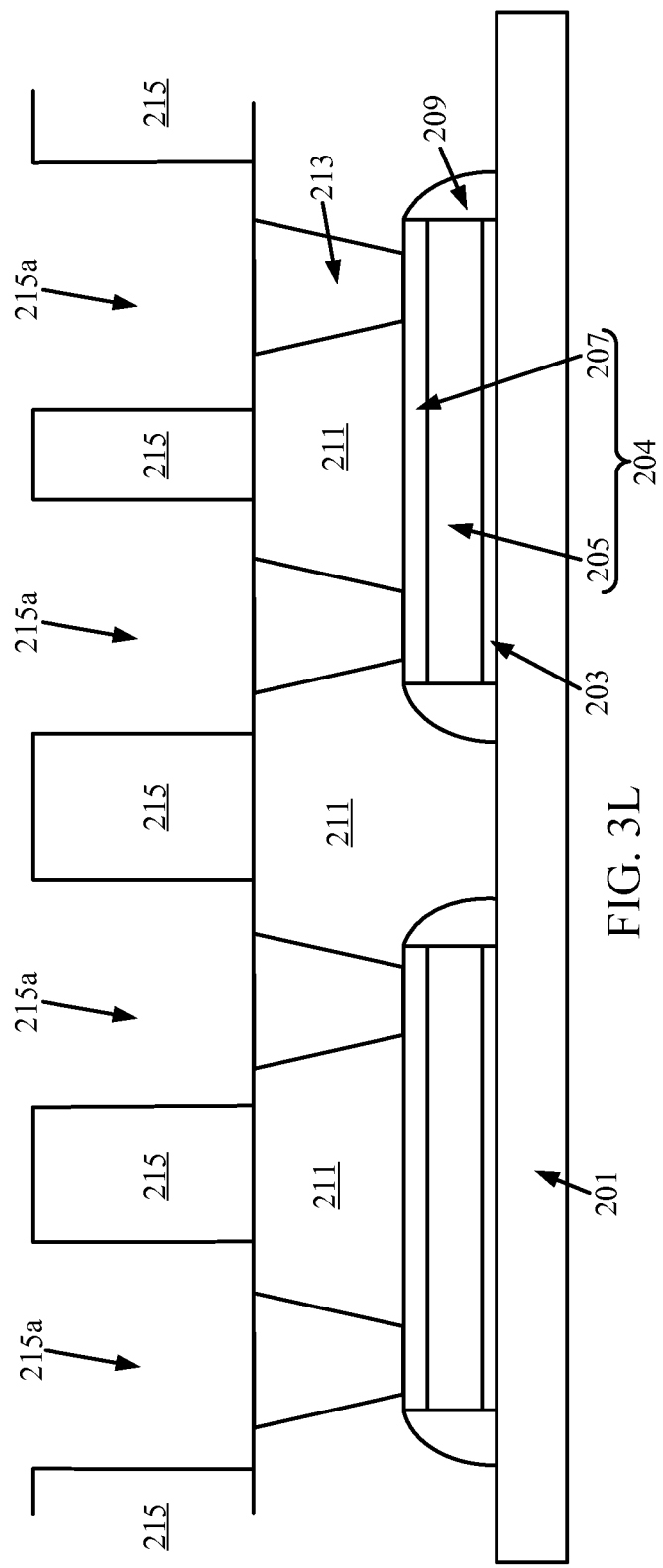
Figure 3M:
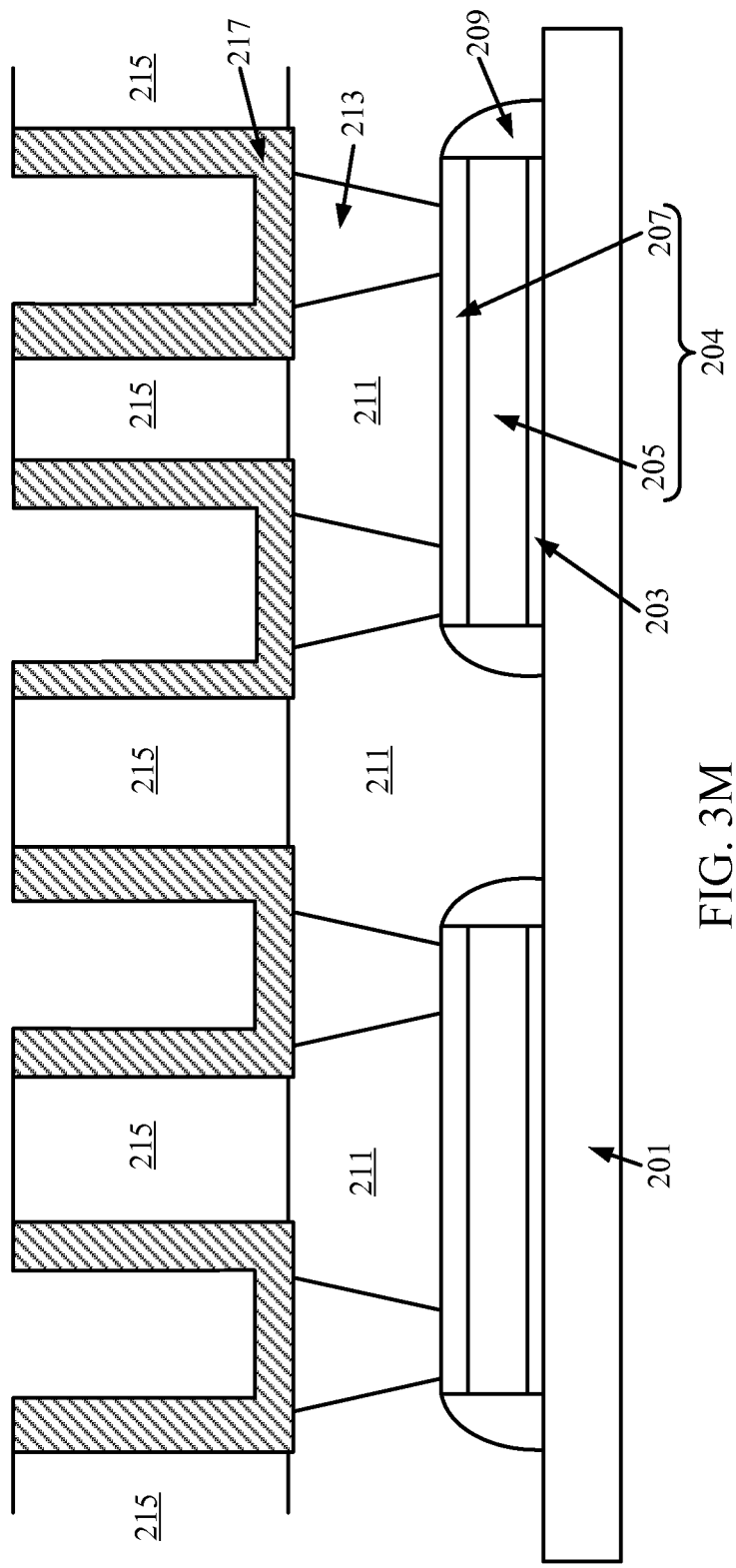
Figure 3N:
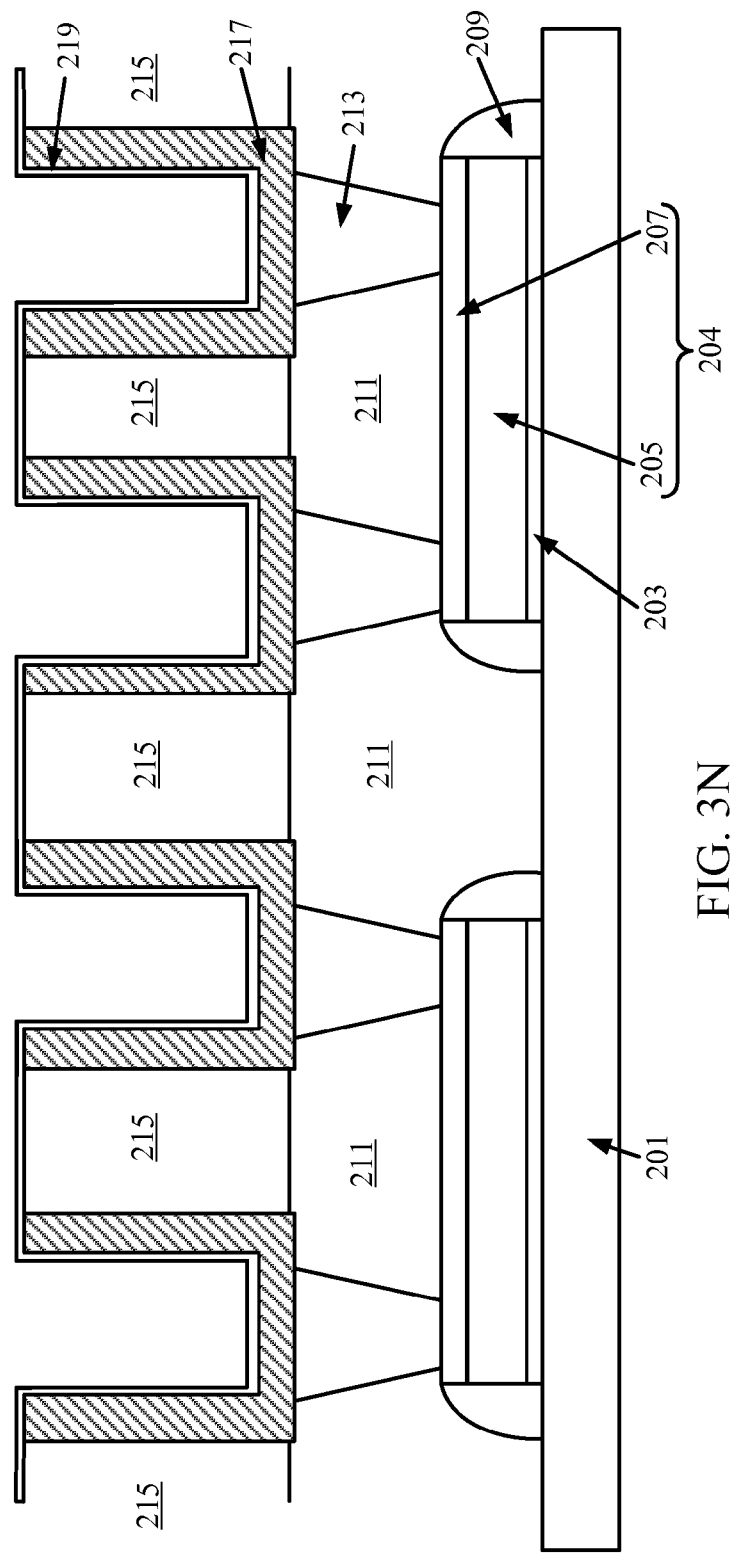
Figure 3O:
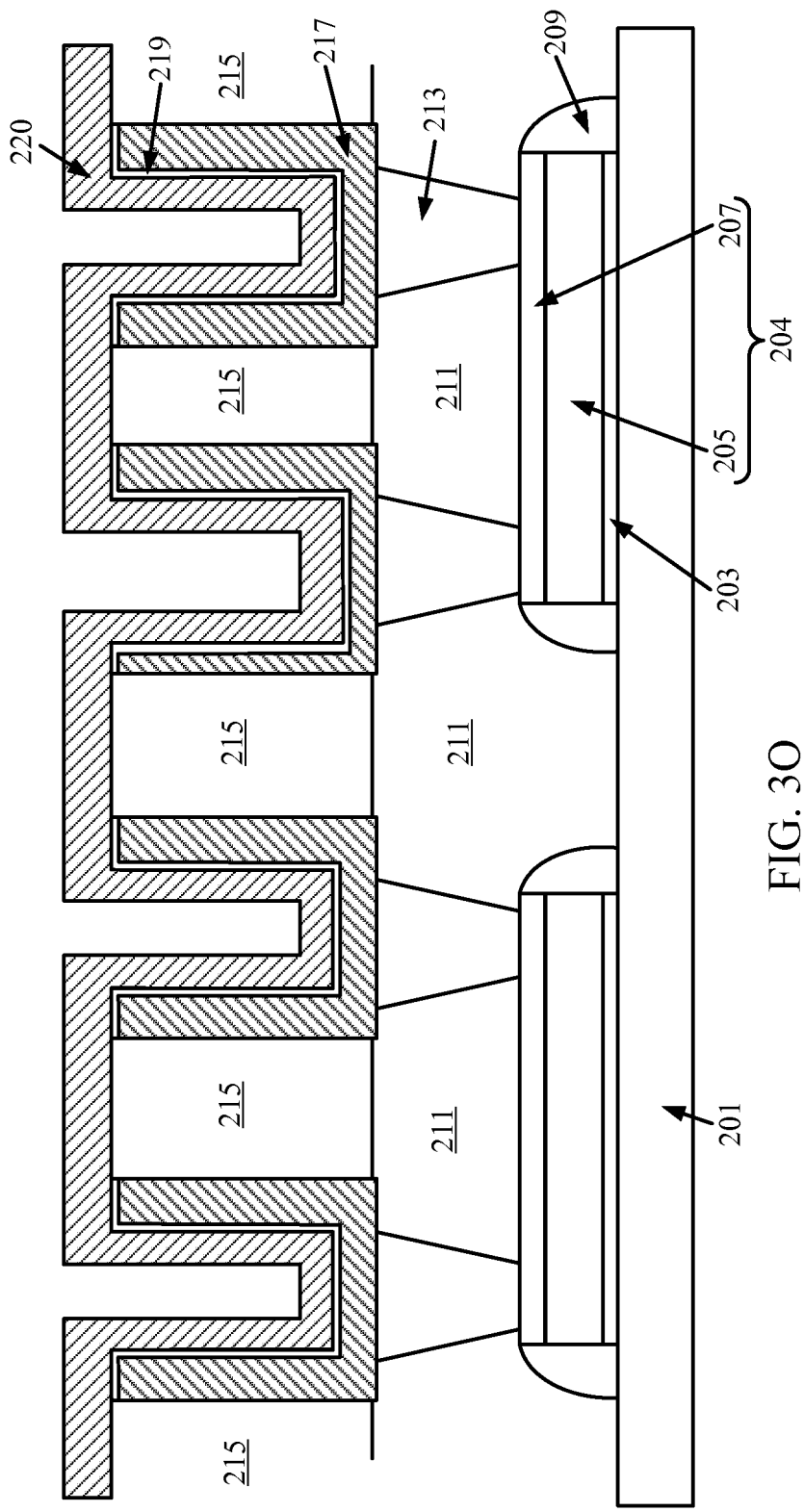
Figure 3P:
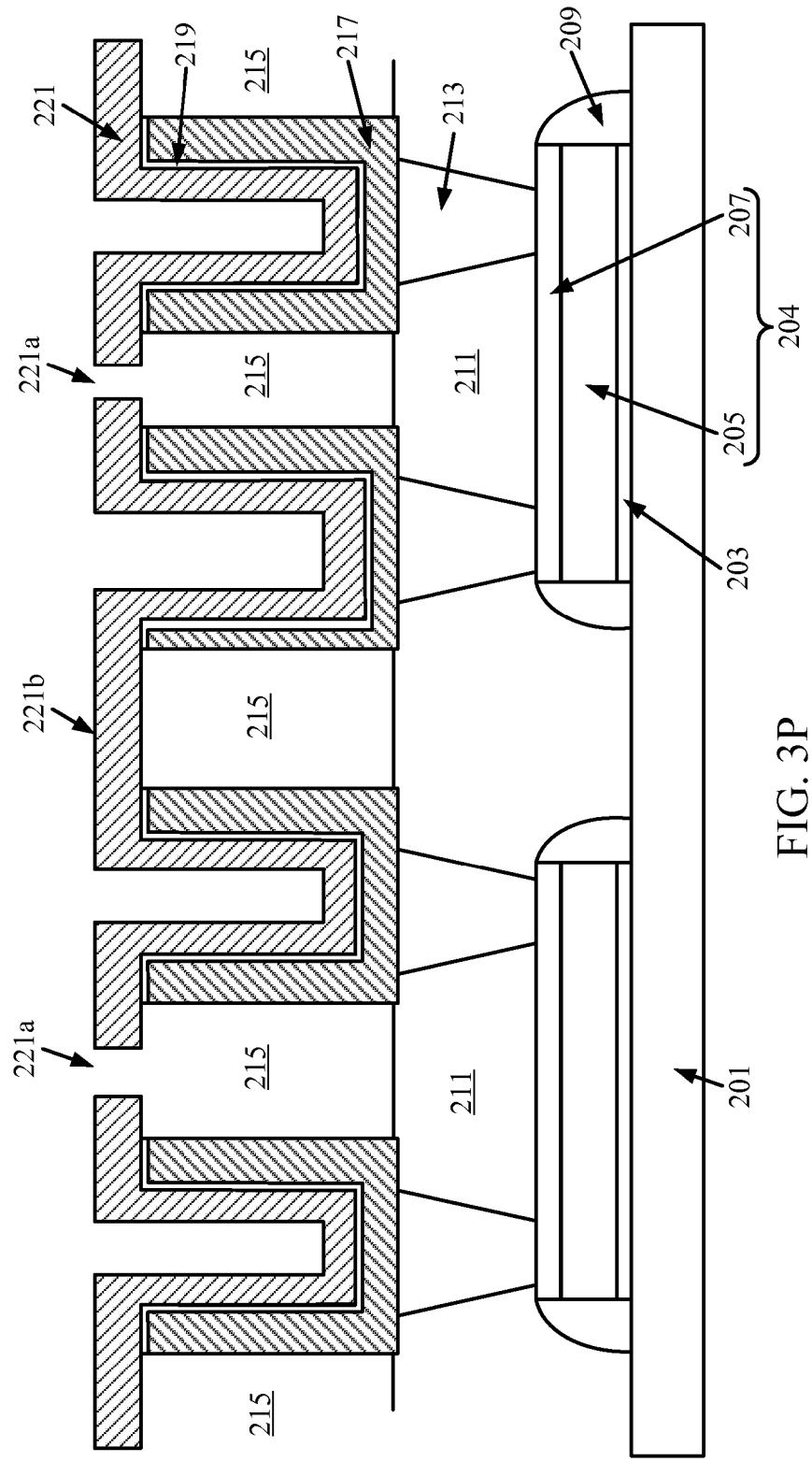
Figure 3Q:
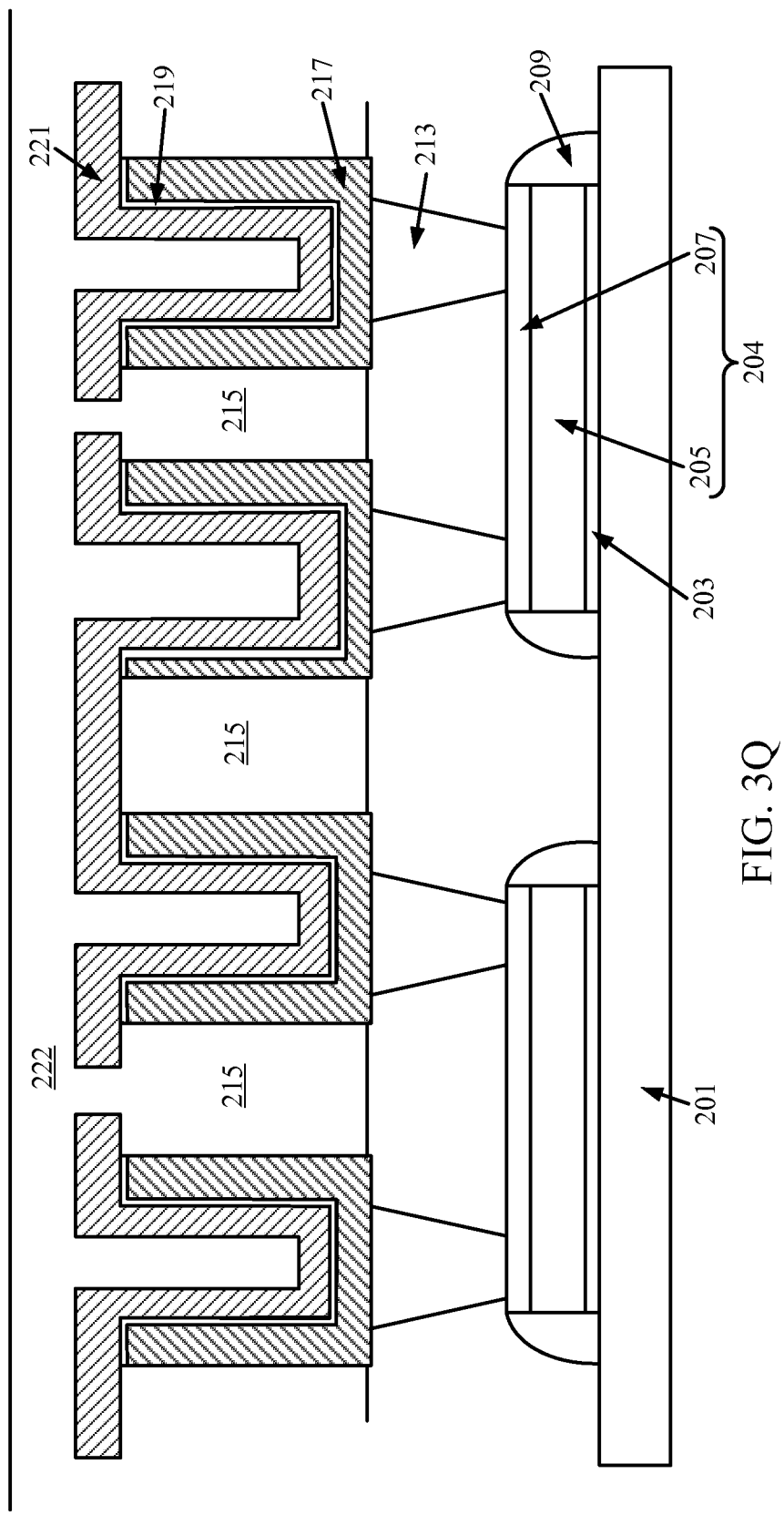
Figure 3R:
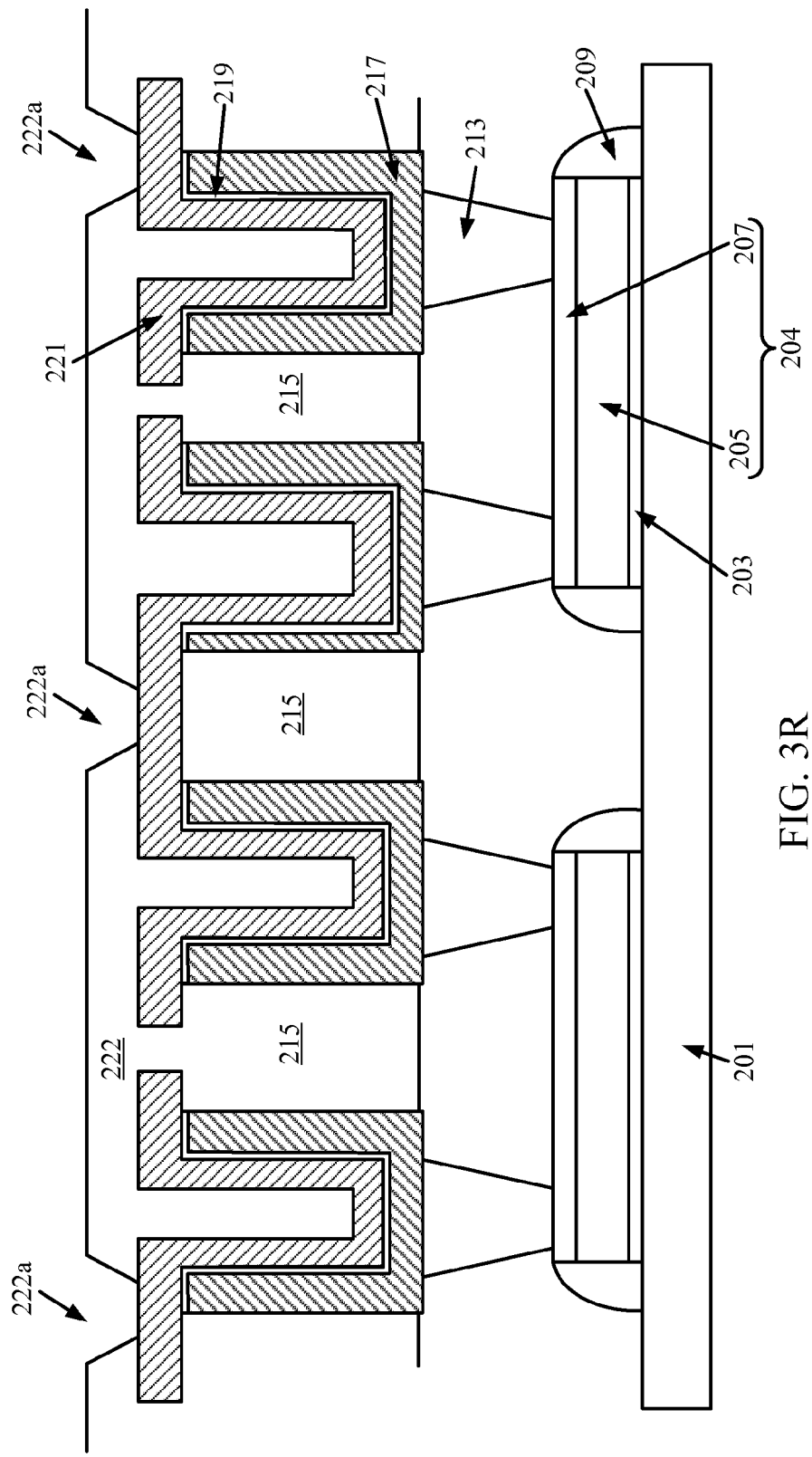
Figure 3S:
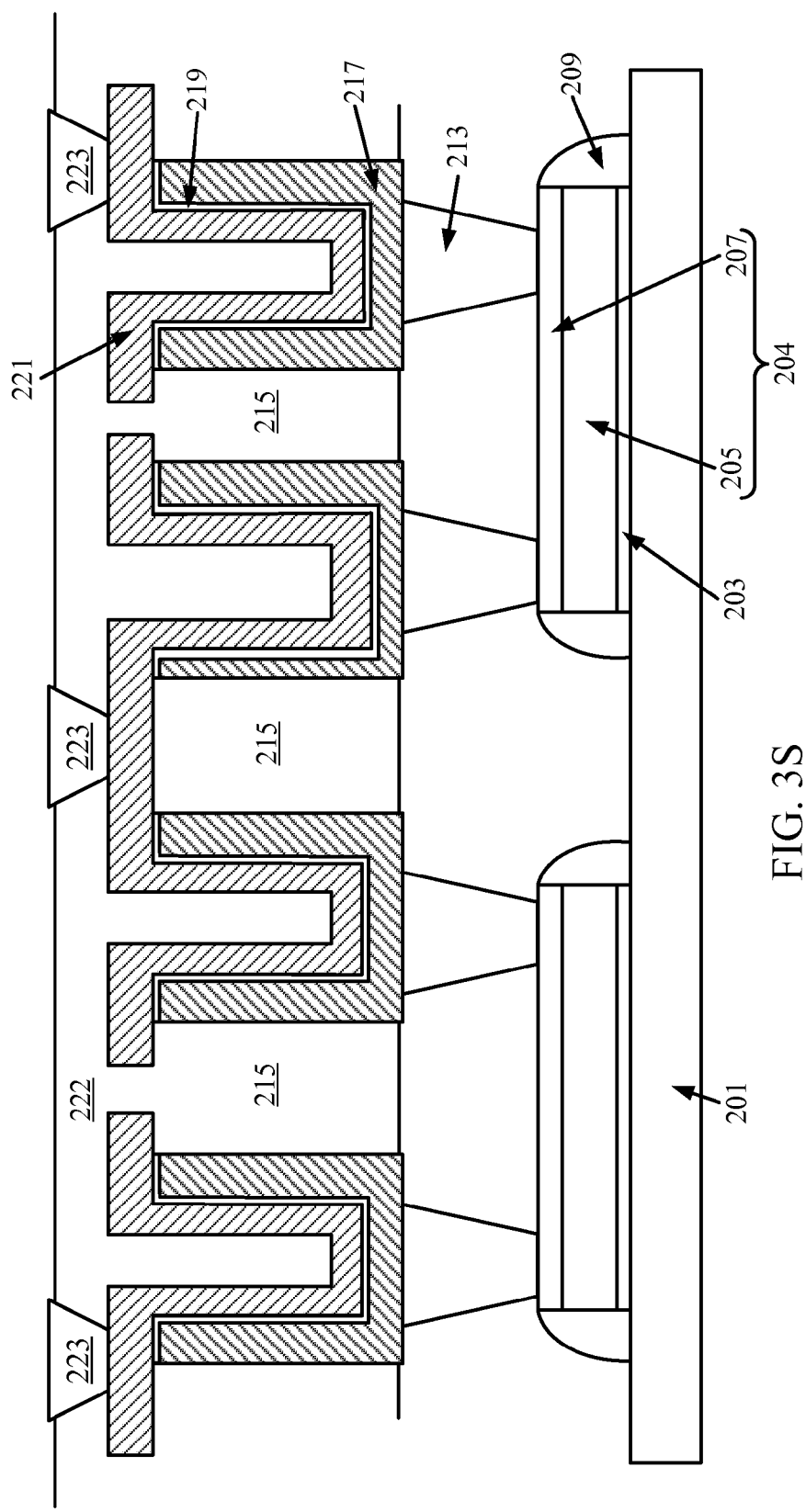
Figure 3T:
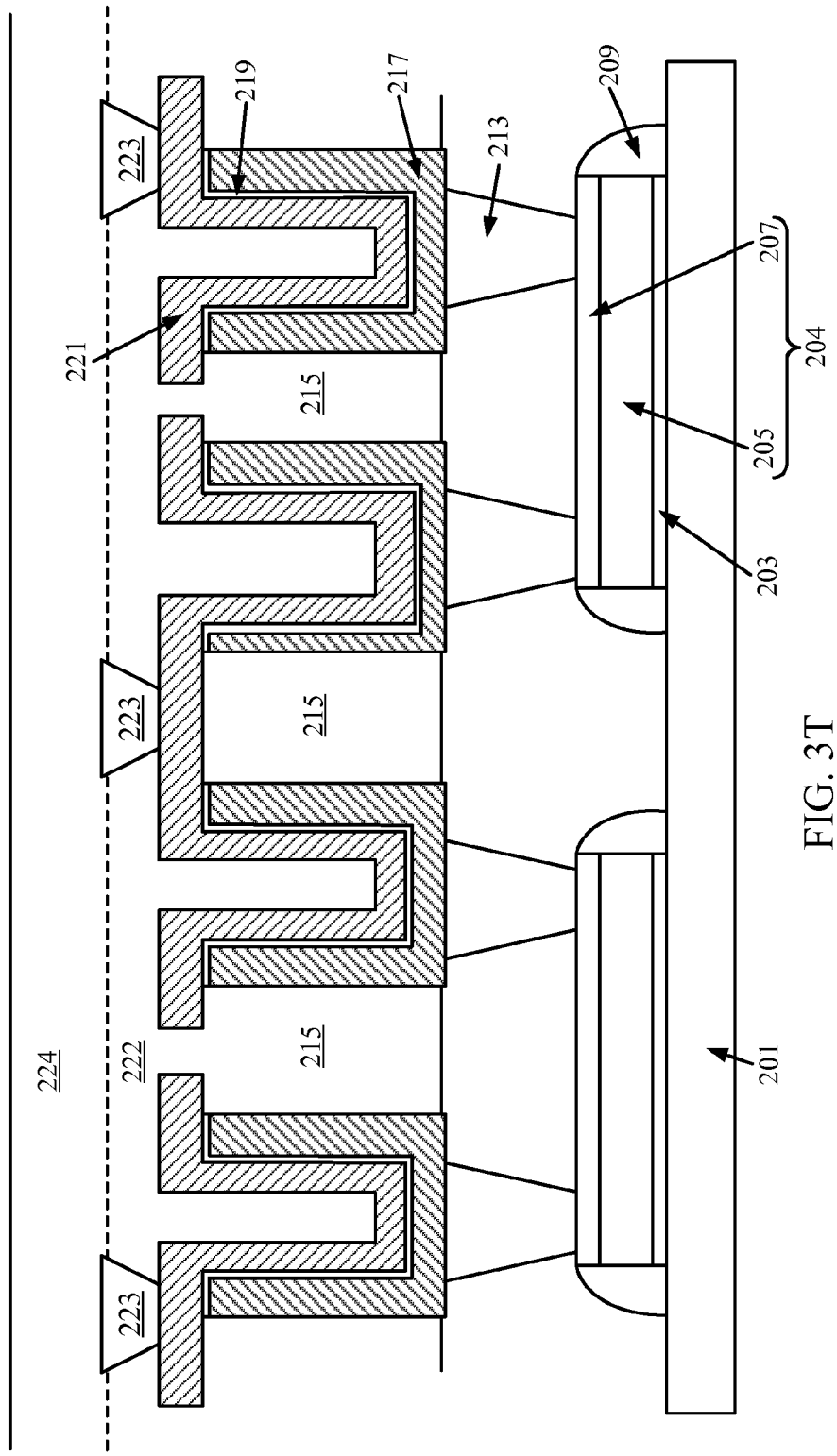
Figure 3U:
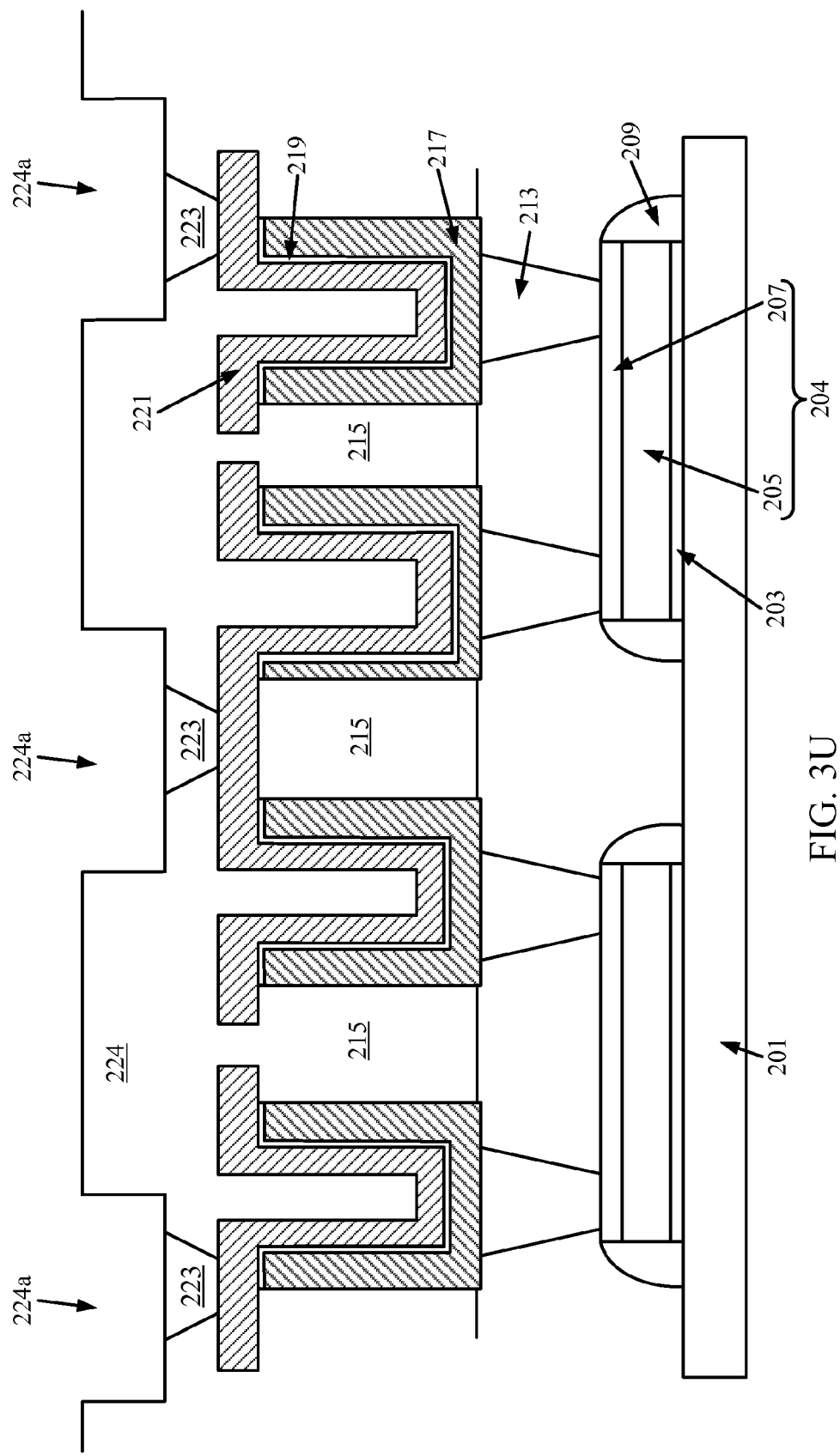
Figure 3V:
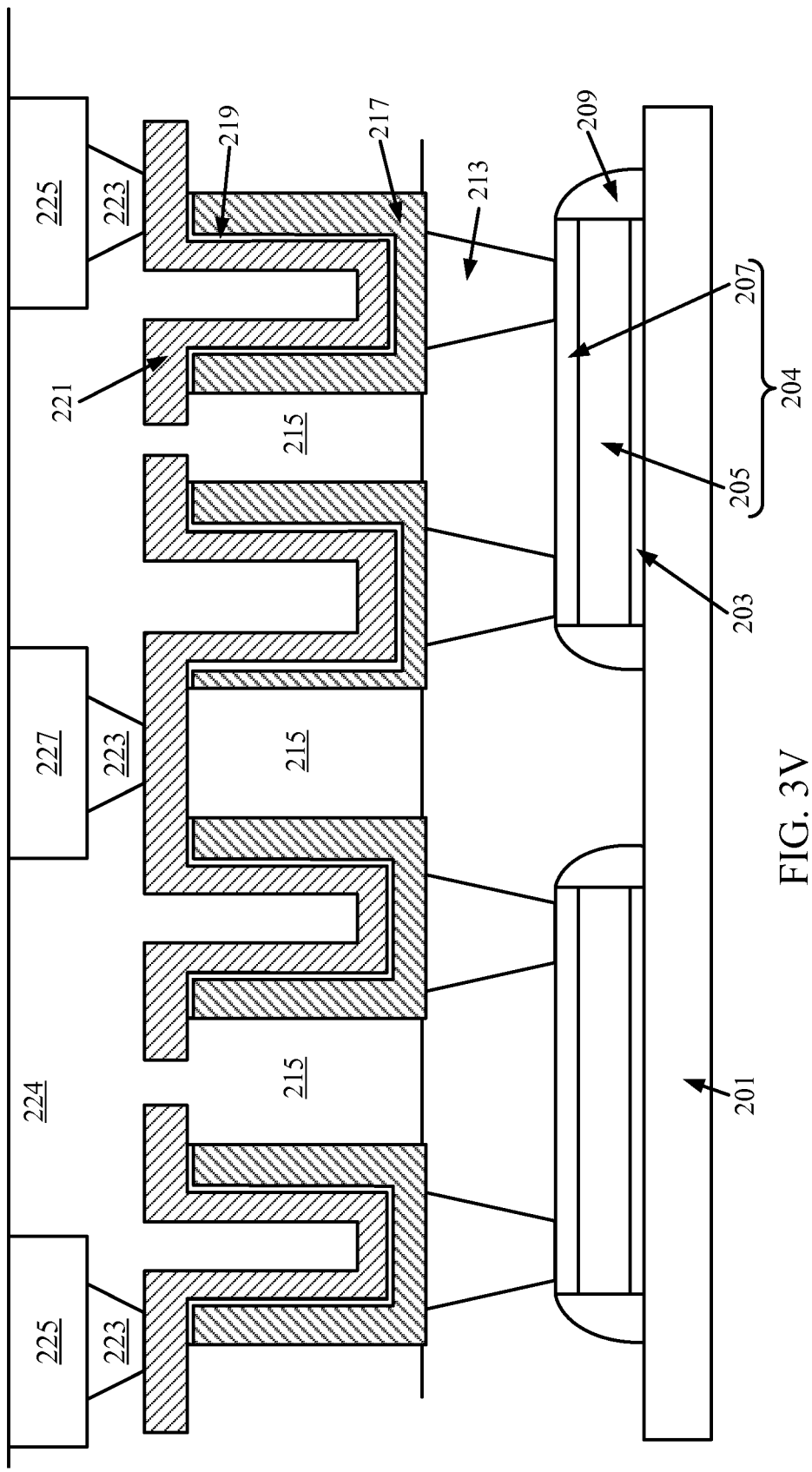

FIGS. 3A to 3V illustrate cross sectional views illustrating a process of manufacturing a high breakdown voltage embedded MIM capacitor according to an exemplary embodiment. First, as shown in FIGS. 3A and 3B, the first insulating layer 203 may be placed on substrate 201. For example, the first insulating layer 203 may be formed of an oxide based material.

As shown in FIGS. 3C and 3D, the gate material 204 (the doped layer 205 and the first metal layer 207) may be deposited on the first insulating layer 203. The gate material 204 may include multiple layers (the doped layer 205 and the first metal layer 207) or may be formed of a single layer (not shown).

As shown in FIG. 3E, first hole portions 209a may be formed in the first insulating layer 203 and the gate material 204, such that a plurality of gate portions are patterned or formed on the substrate 201. Further, the first hole portions 209a may be patterned/formed by conventional lithography methods. For example, a mask(s) may be applied to cover portions of the surface of the gate material 204 and an etchant is applied forming the first hole portions 209a.

As shown in FIG. 3F, a second insulating layer 209 can be deposited over the surface of the gate material 204 and the substrate 201. For example, the second insulating layer 209 may be an oxide based material. Further, the second insulating layer 209 may be of the same material as the first insulating layer 203 such that the gate material 204 is encapsulated by either the first insulating layer 203 or the second insulating layer 209.

As shown in FIG. 3G, second hole portions 209b may be formed in the second insulating layer 209 via a conventional etching process such that the plurality of gate portions formed on the substrate 201 are encapsulated by the first insulating layer 203 and the second insulating layer 209. Further, the second hole portions 209b may be formed via a conventional etching process. For example, a positive or negative mask(s) may be applied to cover portions of the surface of the second insulating layer 209 and an etchant is applied forming the second hole portions 209b.

As shown in FIG. 3H, a third insulating layer 211 can be deposited over the surface of the second insulating layer 209 and the gate material 204. Further, the deposited third insulating layer 211 can be planarized via a Chemical Mechanical Polishing (CMP) process. For example, the third insulating layer 211 may be an oxide based material. Further, the third insulating layer 211 may be of the same material as the first insulating layer 203 or second insulating layer 209 such that the gate material 204 is encapsulated by any of the first insulating layer 203, the second insulating layer 209 or the third insulating layer 211.

As shown in FIG. 3I, third hole portions 213a can be formed in the surface of the third insulating layer 211 and the second insulating layer 209 via a conventional etching process. Further, the third hole portions 213a may be formed by conventional lithography methods including an oxide etch process to remove portions of any oxide covering the contact portions (e.g. 213 in FIG. 3J). For example, a positive or negative mask(s) may be applied to cover portions of the surface of the third insulating layer 211 and an etchant is applied forming the third hole portions 213a.

As shown in FIG. 3J, contacts 213 can be deposited and/or formed in the third hole portions 213a (such that the contacts 213 can be formed in both the second insulating layer 209 and the third insulating layer 211). The contacts 213 can be used to connect the gate material 204 to the capacitors C1, C2, C3 and C4. For example, contacts 213 may connect the gate material 204 with capacitors C1 and C2 in series and may also connect the gate material 204 with capacitors C3 and C4 in series. Further, the contacts 213 can be encapsulated by the third insulating layer 211 and the second insulating layer 209. The surface of the contacts 213 may be planarized by a Chemical Mechanical Polishing (CMP) process.

As shown in FIG. 3K, a fourth insulating layer 215 may be deposited/formed on top of the third insulating layer 211. For example, the fourth insulating layer 215 may be formed of an oxide based material. The fourth insulating layer 215 can be used in order to electrically isolate capacitors C1, C2, C3 and C4. Furthermore, the fourth insulating layer 215 may be of the same material as the first insulating layer 203, second insulating layer 209 or third insulating layer 211.

As shown in FIG. 3L, fourth hole portions 215a can be formed in the surface of the fourth insulating layer 215 via a conventional etching process. Further, the fourth hole portions 215a may be formed by conventional lithography methods including an oxide etch process to remove portions of any oxide covering the contact portions 213. For example, a positive or negative mask(s) may be applied to cover portions of the surface of the fourth insulating layer 215 and an etchant is applied forming the fourth hole portions 215a. After the fourth insulating layer 215 is etched, the fourth hole portions 215a form a well-type structure in the fourth insulating layer 215.

As shown in FIG. 3M, a plurality of lower electrodes 217 may be deposited/formed on the fourth insulating layer 215 and the contacts 213. Each of the lower electrodes 217 may be used in order to form capacitors C1, C2, C3 and C4. The surface of the lower electrodes 217 may be planarized by a CMP process.

As shown in FIG. 3N, the dielectric layer 219 may be deposited/formed on the plurality of lower electrodes 217. Further, the dielectric layer 219 may also be deposited/formed on the upper surface of each of the lower electrodes 217 in order to maximize the surface area of the plates for each of the capacitors C1, C2, C3 and C4. For example, the dielectric layer 219 may be of a high-k oxide type. Further, dielectric layer 219 may also be formed on fourth insulating layer 215. However, dielectric layer 219 may be removed from portions covering fourth insulating layer 215 (not shown).

As shown in FIG. 3O, a single upper electrode 220 may be formed on the fourth insulating layer 215 and directly on top of portions of the dielectric layer 219. Further, in this exemplary embodiment the single upper electrode 220 is a single metal layer. The surface of the single upper electrode 220 may be planarized by a CMP process.

As shown in FIG. 3P, the single upper electrode 220 can be subsequently divided into a plurality of upper electrodes 221, some of which are separated by fifth hole portions 221a via a conventional etching process. However, portions of the upper electrodes may also remain connected to each other (221b). For example, a positive or negative mask(s) may be applied to cover portions of the surface of the single upper electrode 220 and an etchant is applied forming the fifth hole portions 221a. Further, each of the upper electrodes 221 may be used in order to form capacitors C1, C2, C3 and C4. Further, for example, the portion of the upper electrodes that remain connected (221b) can connect capacitors C1 and C2 in parallel with capacitors C3 and C4 (shown in FIG. 2A).

As shown in FIG. 3Q, a fifth insulating layer 222 may be deposited/formed on top of the fourth insulating layer 215 and the plurality of upper electrodes 221. For example, the fifth insulating layer 222 may be formed of an oxide based material. The fifth insulating layer 222 can be used in order to electrically isolate capacitors C1, C2, C3 and C4. Furthermore, the fifth insulating layer 222 may be of the same material as any of the preceding insulating layers (e.g., 203, 209, 211 and/or 215).

As shown in FIG. 3R, sixth hole portions 222a can be formed in the surface of the fifth insulating layer 222 via a conventional etching process. Further, the sixth hole portions 222a may be formed by conventional lithography methods including an oxide etch process to remove portions of any oxide covering the connection portions (e.g. plurality of contacts 223 in FIG. 3S). For example, a positive or negative mask(s) may be applied to cover portions of the surface of the fifth insulating layer 222 and an etchant is applied forming the sixth hole portions 222a. Further, sixth hole portions 222a may have sloped sidewalls of an arbitrary slope.

As shown in FIG. 3S, the plurality of contacts 223 may be formed which can connect storage metal plates 225 and common plate 227 (shown in FIG. 3V) to the upper electrodes 221. The plurality of contacts 223 may be deposited/formed on the sixth insulating layer 222 and the sixth hole portions 222a. The surface of the contacts 223 may be planarized by a CMP process.

As shown in FIG. 3T, a sixth insulating layer 224 may be deposited/formed on top of the fifth insulating layer 222 and the plurality of contacts 223. For example, the sixth insulating layer 224 may be formed of an oxide based material. Furthermore, the sixth insulating layer 224 may be of the same material as any of the preceding insulating layers (e.g., 203, 209, 211, 215 and/or 222).

As shown in FIG. 3U, seventh hole portions 224a can be formed in the surface of the sixth insulating layer 224 via a conventional etching process. Further, the seventh hole portions 224a may be formed by conventional lithography methods including an oxide etching process to remove portions of any oxide covering the plurality of connection portions 223. For example, a positive or negative mask(s) may be applied to cover portions of the surface of the sixth insulating layer 224 and an etchant is applied forming the seventh hole portions 224a.

As shown in FIG. 3V, the plurality of storage metal plates 225 and the common plate 227 may be formed directly on top of the contacts 223 and within the seventh hole portions 224a. Further, the plurality of storage metal plates 225 and the common plate 227 can provide electrical connection between capacitors C1, C2, C3 and C4 and any voltage sources (not shown). Furthermore, the storage metal plates 225 and the common plate 227 may be orthogonal to the upper electrodes 221. In another exemplary embodiment, the connection between the storage metal plates 225/common plate 227 and the contacts 223 may be located outside of the MIM capacitor 200. The surface of the storage metal plates 225 and the common plate 227 may be planarized by a CMP process.

It will be appreciated, as discussed above, that plates 225 and 227 may run orthogonal to the upper electrodes and that a plurality of MIM capacitors 200 may be formed in an array pattern interconnected by plates 225 and 227 so that the capacitance may be increased by increasing the number of MIM capacitors 200 interconnected. For example, an array of MIM capacitors C1a, C2a, C3a, C4a; C1b, C2b, C3b, C4b; and C1c, C2c, C3c, C4c could each be connected to plates 225 and 227. Specifically, a first portion of storage metal plate 225 may be connected to the top electrodes of C1a-c.

Likewise, a second portion of storage metal plate 225 may be connected to the top electrodes of C3a-c and the first and second portions of storage metal plate 225 may be coupled together (e.g., by a third portion outside the capacitor array or any other suitable connection). Additionally, the common top electrode portion (e.g., 221b of FIG. 2A) of C2a-c and C4a-c can be connected to common plate 227. Accordingly, the capacitance between plates 225 and 227 can be increased.

It will be appreciated that semiconductor devices using high-breakdown voltage embedded capacitor structures as illustrated, for example in FIG. 2A may be included within a mobile phone, portable computer, hand-held personal communication system (PCS) unit, portable data units such as personal data assistants (PDAs), GPS enabled devices, navigation devices, set-top boxes, music players, video players, entertainment units, fixed location data units such as meter reading equipment, or any other device that stores or retrieves data or computer instructions, or any combination thereof.

Accordingly, embodiments of the disclosure may be suitably employed in any device which includes such high-breakdown voltage embedded capacitor structures.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The foregoing disclosed devices and methods are typically designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements may be described or claimed in the singular, the plural is contemplated unless limitation to the singular is explicitly stated.

What is claimed is:

1. A semiconductor device, comprising:
   gate material embedded in an insulator; and
   first and second capacitors, each capacitor comprising: a lower electrode; a dielectric formed so as to cover the surface of the lower electrode; and an upper electrode formed on the dielectric, wherein the lower electrode, dielectric, and upper electrode are well-type structures, and
   wherein metal contacts couple the lower electrode of each of the first and second capacitors to a first gate material, and wherein the first and second capacitors are connected in series via the first gate material;
   third and fourth capacitors, each capacitor comprising: a lower electrode; a dielectric formed so as to cover the surface of the lower electrode; and an upper electrode formed on the dielectric and
   wherein metal contacts couple the lower electrode of each of the third and fourth capacitors to a second gate material, wherein the third and fourth capacitors are connected in series via a second gate material, and
   wherein the upper electrodes of the second capacitor and the fourth capacitor share a common metal portion, and wherein the common metal portion is electrically coupled to a first voltage terminal through a first metal plate; and
   wherein the upper electrodes of the first capacitor and the third capacitor are electrically coupled to a second voltage terminal through a second metal plate.

2. The semiconductor device of claim 1, wherein the gate material includes a first layer and a second layer.

3. The semiconductor device of claim 2, wherein the first layer of the gate material is a NiSi material.

4. The semiconductor device of claim 2, wherein the second layer of the gate material is a n+ doped material.

5. The semiconductor device of claim 2, wherein the second layer of the gate material is a p+ doped material.

6. The semiconductor device of claim 1, wherein the gate material is formed on a first insulating layer and wherein the gate material is at least three times thicker than the first insulating layer.

7. The semiconductor device of claim 1, wherein the capacitors are a metal insulator metal (MIM) capacitor type.

8. The semiconductor device of claim 1, wherein the dielectric is of a high k dielectric type.

9. The semiconductor device of claim 1, further comprising a device, selected from the group consisting of a set top box, music player, video player, entertainment unit, navigation device, communications device, personal digital assistant (PDA), fixed location data unit, and a computer, into which the semiconductor device is integrated.

10. A semiconductor device comprising:
   means for insulating a gate material;
   first and second capacitors, each comprising: a lower electrode; a dielectric formed so as to cover a surface of the lower electrode; and an upper electrode formed on the dielectric, wherein the lower electrode, dielectric, and upper electrode are well-type structures; and
   means for coupling each of the first and second capacitors to a first gate material, wherein the first and second capacitors are connected in series via the first gate material;
   third and fourth capacitors, each capacitor comprising: a lower electrode; a dielectric formed so as to cover the surface of the lower electrode; and an upper electrode formed on the dielectric and
   means for coupling each of the third and fourth capacitors to a second gate material, wherein the third and fourth capacitors are connected in series via the second gate material; and
   wherein the upper electrodes of the second capacitor and the fourth capacitor share a common metal portion, and wherein the common metal portion is electrically coupled to a first voltage terminal through a first coupling means; and
   wherein the upper electrodes of the first capacitor and the third capacitor are electrically coupled to a second voltage terminal through a second coupling means.

11. The semiconductor device of claim 10, wherein the gate material includes a first layer and a second layer.

12. The semiconductor device of claim 11, wherein the first layer of the gate material is a NiSi material.

13. The semiconductor device of claim 11, wherein the second layer of the gate material is a n+ doped material.

14. The semiconductor device of claim 11, wherein the second layer of the gate material is a p+ doped material.

15. The semiconductor device of claim 10, wherein the gate material is formed on a first insulating layer and wherein the gate material is at least three times thicker than the first insulating layer.

16. The semiconductor device of claim 1, wherein the first voltage terminal is a common or ground source, and the second voltage terminal is a positive voltage source.

17. The semiconductor device of claim 1, wherein the series connection of the first and second capacitors is connected in parallel to the series connection of the third and fourth capacitors.

18. The semiconductor device of claim 1, wherein the first and second metal plates are orthogonal to the upper electrodes of the first, second, third, and fourth capacitors.

19. The semiconductor device of claim 18, wherein a plurality of capacitors are interconnected by the first and second metal plates to the first, second, third, and fourth capacitors, such that the plurality of capacitors and the first, second, third, and fourth capacitors form an array of capacitors.

* * * * *